United States Patent [19]
Einthoven et al.

[11] 4,035,828
[45] July 12, 1977

[54] SEMICONDUCTOR INTEGRATED CIRCUIT DEVICE

[75] Inventors: Willem Gerard Einthoven, Belle Mead, N.J.; Anthony Joseph Caravaggio, Wilkes Barre, Pa.; Albert Alexander Todd, Piscataway, N.J.

[73] Assignee: RCA Corporation, New York, N.Y.

[21] Appl. No.: 688,577

[22] Filed: May 21, 1976

[51] Int. Cl.² .................................... H01L 27/04
[52] U.S. Cl. ............................ 357/47; 357/20; 357/46
[58] Field of Search ............... 357/46, 47, 38, 86, 357/20, 40; 307/315

[56] References Cited
U.S. PATENT DOCUMENTS

| 3,671,821 | 6/1972 | Nakata et al. | 357/38 |
| 3,836,996 | 9/1974 | Schilp et al. | 357/46 |

FOREIGN PATENT DOCUMENTS

| 47-22430 | 1972 | Japan | 357/38 |

*Primary Examiner* — Michael J. Lynch
*Assistant Examiner* — James W. Davie
*Attorney, Agent, or Firm* — H. Christoffersen; R. P. Williams; R. A. Hays

[57] ABSTRACT

A semiconductor integrated circuit device which may be utilized as a Darlington circuit having an input stage and an output stage is disclosed. The Darlington may be characterized as having an increased isolation between the input stage and the output stage.

7 Claims, 6 Drawing Figures

SEMICONDUCTOR INTEGRATED CIRCUIT DEVICE

The present device generally relates to semiconductor integrated circuit devices and, in particular, to those which can be used as Darlington circuit devices.

Conventional semiconductor integrated Darlington circuit devices comprise a number of parasitic elements. As with most parasitic elements, it is desirable to remove the effect thereof since parasitics generally drain energy from the device thus requiring a compensating amount of energy to be initially applied thereto. In integrated circuit devices wherein one element feeds energy to another element, such as in a Darlington circuit device, parasitics also tend to provide undesirable energy paths between the elements. Since this energy tends to interfere with the proper operation of successive elements, isolation is often provided between such elements. Often this isolation takes the form of a moat between successive elements. Moat isolation has a number of drawbacks. For example, a moat takes up a portion of a semiconductor wafer which could otherwise be used for other elements. Moreover, a moat must be accurately positioned so as to be effective, and such accuracy requires precise processing procedures which take a considerable amount of time, making a moat an undesirable alternative.

Figure 3:
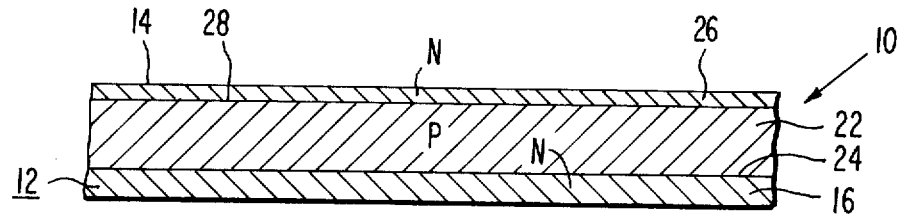
Figure 4:
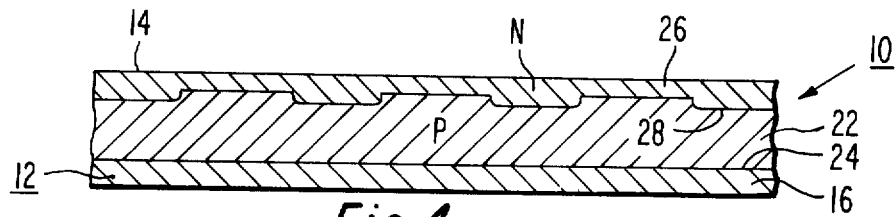
Figure 5:
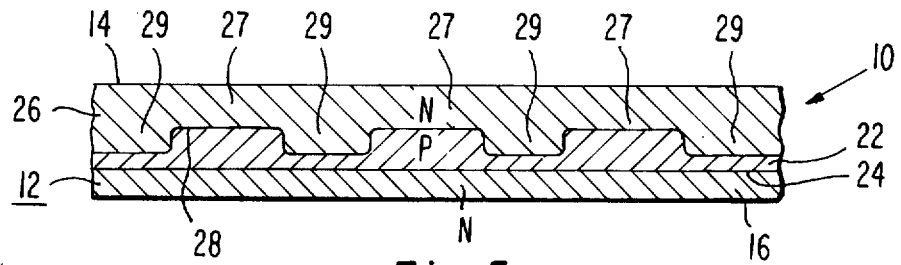

FIGS. 3, 4, and 5 are partial cross-sectional views of the present device at different stages of its fabrication, not drawn to scale.

Figure 6:
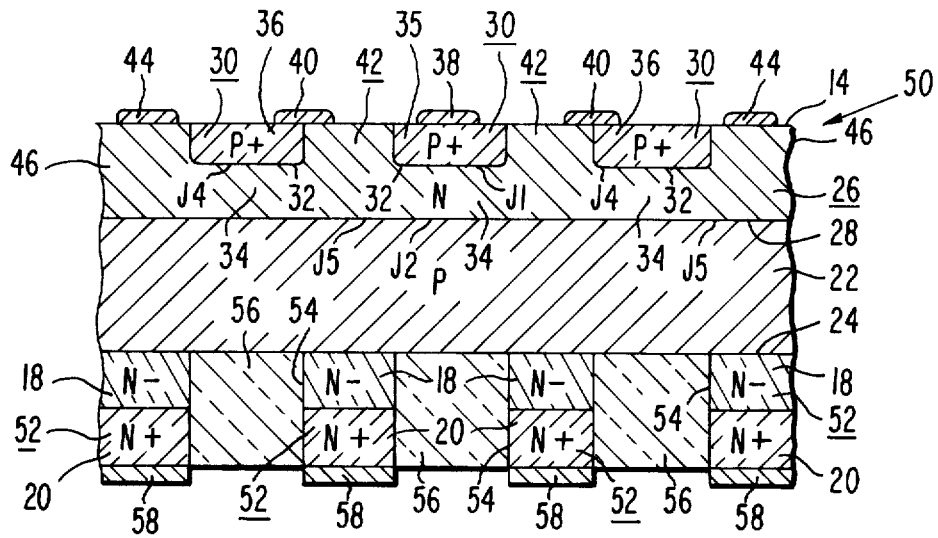

FIG. 6 is a partial cross-sectional view of a second embodiment of the present device, not drawn to scale.

One embodiment of the present device, indicated generally at 10 in the FIGS. 1 through 5, comprises a body 12 of semiconductor material, for example, silicon, having a surface 14 and having a one type conductivity, N type, for example. The body 12 contains a first region 16 which, for reasons known in the art, preferably has a comparatively lower conductivity upper portion 18 and a comparatively higher conductivity lower portion 20. It is preferred that the average impurity concentration of the upper portion 18 be about $5 \times 10^{14}$ atoms/cm$^3$ and that of the lower portion 20 be about $5 \times 10^{18}$ atoms/cm$^3$.

A second region 22 of semiconductor material having a second type conductivity, P type in this example, is adjacent the first region 16 and forms a first PN junction 24 therewith. It is preferred that the average impurity concentration of the second region 22 be on the order of about $5 \times 10^{14}$ atoms/cm$^3$.

Figure 2:
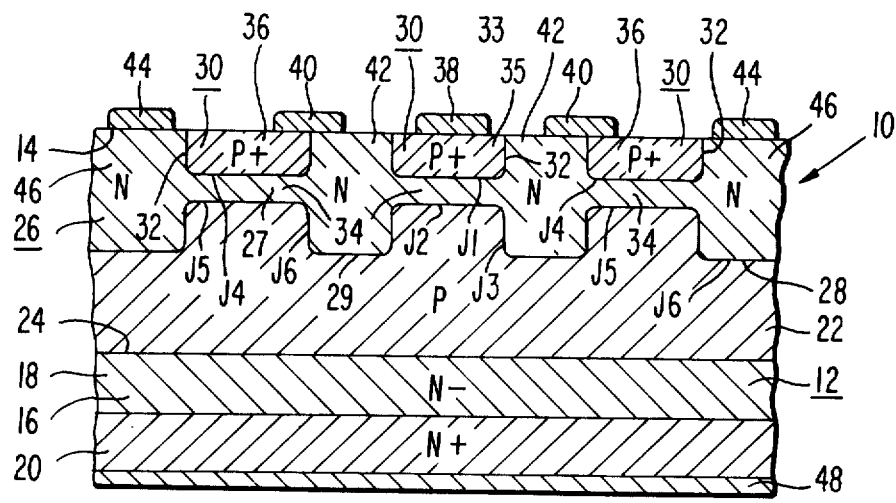
FIG. 2 is a partial cross-sectional view of the preferred embodiment of the present device taken along the line 2—2 of FIG. 1, not drawn to scale.

A third region 26 of semiconductor material having the one type conductivity is adjacent the surface 14 and forms a second PN junction 28 with said second region 22. The third region 26 is spaced apart from the first region 16 by the second region 22. In the preferred embodiment, as shown in FIG. 2, for reasons explained below, the third region 26 has a plurality of comparatively shallow portions 27 and a plurality of comparatively deeper portions 29 with respect to the surface 14. Preferably the third region 26 has a surface impurity concentration on the order of about $5 \times 10^{20}$ atoms/cm$^3$, an impurity concentration of about $5 \times 10^{14}$ atoms/cm$^3$ at the second PN junction 28 between the comparatively deeper portion 29 and the second region 22 and also an impurity concentration of about $5 \times 10^{14}$ atoms/cm$^3$ at the second PN junction 28 between the comparatively shallower portions 27 and the second region 22.

A plurality of fourth regions 30 having the second type conductivity is adjacent the surface 14. Each region 30 forms a third PN junction 32 with the third region 26. The fourth regions 30 are spaced apart from the second region 22 by a portion 34 of the third region 26 which is thin compared to the remainder of the third region 26. Preferably the plurality of fourth regions 30 have a surface impurity concentration on the order of about $10^{19}$ atoms/cm$^3$. In the preferred embodiment, the thin portion 34 is on the order of about 2 micrometers thick.

Figure 1:
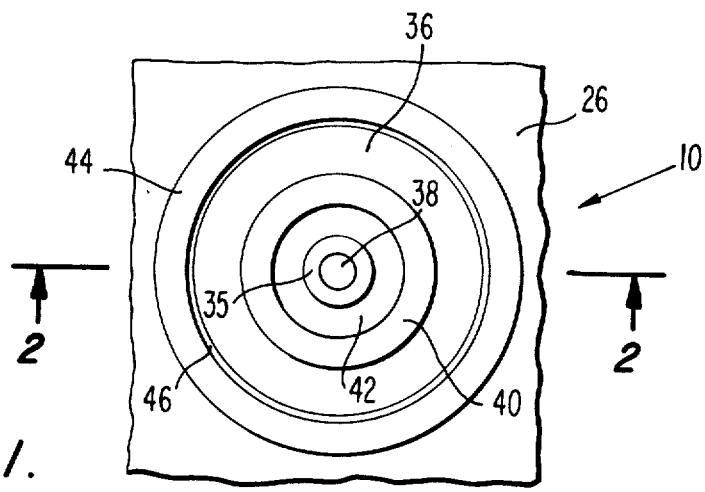
FIG. 1 is a partial elevation view of the preferred embodiment of the present device, not drawn to scale.

As shown in FIG. 1, it is preferred that a first member 35 of the plurality of fourth regions 30 is substantially centrally located in the third region 26 and a second member 36 of the plurality of fourth regions 30 is annular and axially aligned with the first member 35.

First electrode means 38 electrically contact the first member 35 of the plurality of fourth regions 30.

Interconnecting electrode means 40 electrically contact the second member 36 of the plurality of fourth regions 30 and a first surface portion 42 of the third region 26. The first surface portion 42 is defined as the material of the third region 26 between the first member 35 and the second member 36 of the plurality of fourth regions 30. The interconnecting electrode means 40 contacts the first surface portion 42 and the second member 36 at the surface 14.

Second electrode means 44 electrically contact a second surface portion 46 of the third region 26. The second surface portion 46 is defined as the material of the third region 26 which is substantially spaced apart from the first surface portion 42 by the second member 36 of the plurality of fourth regions 30.

Third electrode means 48 electrically contact the comparatively higher conductivity lower portion 20 of the first region 16.

A second embodiment, indicated in FIG. 6 at 50, and wherein features which are substantially the same as those of the preferred embodiment, shown in FIG. 2, are indicated, for increased clarity, with the same numerals, has a third region 26 having a uniform thickness with respect to the surface 14. The device 50 can be fabricated using known techniques. However, in the preferred embodiment shown in FIG. 2, where the third region 26 has a non-uniform thickness, the following fabrication technique is preferred. FIGS. 3, 4, and 5 show partial cross-sectional views of the device 10 at different stages of its fabrication. Referring to FIG. 3 a comparatively low surface concentration of N type dopants, for example phosphorus, is introduced into the second region 22 across the surface 14. As shown in FIG. 4, a comparatively higher surface concentration of N type dopants is then selectively introduced at positions where the third region 26 is to be comparatively thicker. This may be accomplished using known masking and photolithographic techniques. Upon driving in the dopants, FIG. 5, the comparatively lower surface concentration areas do not penetrate the second region 22 as deeply as the areas of initially comparatively higher surface concentration. The remainder of the fabrication of this embodiment is completed using known techniques.

To facilitate the understanding of the operation of the present device 10, to be discussed below, the device 10 is characterized as follows. The first member 35 of the plurality of fourth regions 30, the comparatively thin portion 34 adjacent thereto and the segment of the second region 22 associated with that thin portion 34 constitute, in this example, the emitter, base and collector regions, respectively, of a first PNP type transistor. The first surface portion 42 of the third region 26, the segment of the second region 22 adjacent thereto and the segment of the first region 16 adjacent therewith constitute, in this example, the emitter, base and collector regions respectively of a first NPN type transistor. Similarly the second member 36, the comparatively thin portion 34 adjacent thereto and the segment of the second region 22 associated therewith constitutes a second PNP transistor; and the second surface portion 46, the segment of the second region 26 adjacent thereto and the segment of the first region 16 adjacent therewith constitutes a second NPN transistor.

The $\beta$ of the first and second PNP transistor is on the order of between from about 100 to 10,000. This is primarily due to a high transport factor which is substantially dependent upon the width of the base regions and the impurity concentration thereof. In this example, the base regions, i.e., the comparatively thin portions 34, preferably have a width of about 2 micrometers and an average impurity concentration on the order of about $10^{15}$ atoms/cm$^3$. The PNP transistors also exhibit a saturation voltage of between from about 0.01 volt to about 0.1 volt. This parameter, as known in the art, is also dependent on the width and carrier concentration of the base regions.

The width of the base regions of the NPN transistors, i.e., the width of the segment of the second region 22 between the second surface portion 46 for example, and the segment of the first region 16 associated therewith, is subject to the following design parameters: 1. It must be thin enough to provide a relatively high transport factor, in this embodiment, about 12 micrometers, 2. It must have a sufficient average impurity concentration to provide good emitter efficiency, in this example about $5 \times 10^{15}$ atoms/cm$^3$, while having a sufficient impurity concentration to prevent premature punchthrough.

The device 10 may be further characterized as having two stages. The first PNP and the first NPN transistors comprising a first, or input, stage and the second PNP and the second NPN transistors comprising a second, or output, stage.

The operation of the device 10 is described below. In one mode of operation the third region 26 is biased negatively with respect to the plurality of fourth regions 30 and the first region 16 is biased positively with respect to the third region 26.

Under the above stated conditions the PN junction, designated as $J_1$ for this description, between the emitter and base regions of the first PNP transistor is forward biased and relatively easily conducts current thereacross. However, because of the different impurity concentrations, i.e., N+ of about $5 \times 10^{20}$ atoms/cm$^3$ at the surface 14 and N material of about $10^{15}$ atoms/cm$^3$ throughout the thin base region of the PNP, the current flowing across the junction $J_1$ substantially completely flows through the thin base region of the first PNP transistor. The PN junction $J_2$, between the base and collector regions of the first PNP transistor, is slightly forward biased due to the respective bias condition on the third region 26 and the first region 16. The current flowing across the base region of the first PNP transistor flows into the collector region thereof. THe collector region of the PNP transistor is a continuation of the base region of the first NPN due to the continuity of the second region 22. The PN junction $J_3$, between the emitter and base regions of the NPN, being forward biased, as discussed above, conducts the PNP current thereacross into the emitter region of the NPN. That is, the first PNP transistor, under these bias conditions, serves as a base current path for the first NPN transistor. The PN junction $J_3$, because of the comparatively lower impurity concentrations, still conducts considerably more current thereacross than the surface portion of PN junction $J_1$ even though that portion of PN junction $J_1$ has a somewhat higher bias potential thereacross. This condition exists even if the PN junctions $J_2$ and $J_3$ are at the same bias potential as in the device 50 shown in FIG. 6. However, the presence of the comparatively shallower portions 27 and the comparatively deeper portions 29 insure that the PN junction $J_3$ conducts more current thereacross than the surface portion PN junction $J_1$. That is, by having comparatively lower conductivity than the device 50 in the comparatively deeper portion 29 the PN junction $J_3$ of the device 10 conducts at a comparatively lower bias potential thereacross.

The current flowing across PN junction $J_3$ is primarily comprised, in this example, of electron flow from the emitter region to the base region. Because of the interconnecting electrode means 40 the electrons are supplied from the emitter region of the second PNP transistor. The PN junctions, $J_4$, $J_5$ and $J_6$, as shown in the Fig. 2, of the output stage, operate under the same mechanisms as the PN junctions $J_1$, $J_2$ and $J_3$ of the input stage. Hence, the input stage provides current to the output stage. Thus, the initial current fed into the emitter region of the first PNP transistor, via the first electrode means 38, is amplified in the usual fashion by the first NPN transistor and that current is then subsequently amplified by the second NPN transistor.

In order to understand the primary advantage of the present device 10, that is, increased parasitic resistance, or isolation, between, for example, the input stage and the output stage, the operation of the present device will now be discussed when the above bias conditions are reversed, that is, when the third region 26 is biased more positively than the plurality of fourth regions 30. For comparison purposes the usual parasitic resistance which the present device 10 eliminates would, but for the presence of the comparatively thinner regions 34, exist between the first electrode means 38 and the interconnecting electrode means 40 and would be comprised of the P type material of the second region 22 therebetween. However, under the reverse bias conditions the PN junctions $J_1$ and $J_5$ are reverse biased and hence substantially no current flows thereacross. Since there is substantially no current flow between the first electrode means 38 and the interconnecting electrode means 40 the input stage and the output stage are substantially completely isolated.

While the first region 16 is shown in FIG. 2 as being continuous under the input stage and the output stage thereby integrally connecting the collector regions of the first and second NPN transistors it is not a critical feature of the present device 10. That is, the first region 16 of the preferred device 10 can be comprised of at least two laterally isolated portions, as shown in FIG. 6. The laterally isolated portions 52 of the second embodiment device 50 are preferably respectively positioned opposite the first and second portions of said third region 26. For example, the collector region of te first and second NPN transistors can be isolated from each other, by methods known in the art. One such method would be to etch a plurality of moats 54. The moats 54 could then be refilled with a mass of glass 56, or remain unfilled, to provide isolation between the portions 52. A plurality of third electrode means 58 electrically contact the portions 52. Hence different bias voltages may be applied to the collector region of the first and second NPN transistors.

As described herein the present devices 10 and 50 can be operated as semiconductor integrated Darlington circuit devices which have good isolation between the input and output stages thereof. Thus such devices have a leakage current which is comparatively lower than conventional devices of a similar type.

What is claimed is:

1. A semiconductor device comprising:
   a body of semiconductor material having a surface and having a first region of a one type conductivity therein;
   a second region of semiconductor material having a second type conductivity and forming a first PN junction with said first region;
   a third region of semiconductor material having said one type conductivity adjacent said surface and forming a second PN junction with said second region, said third region being spaced apart from said first region by said second region;
   a plurality of fourth regions adjacent said surface, having said second type conductivity, within said third region and forming a plurality of third PN junctions therewith, a portion of said third region, comparatively thinner than the remainder thereof, being between each of said fourth regions and said second region, said comparatively thinner portion of said third region being about 2 $\mu$m thick and having an average impurity concentration on the order of about $10^{15}$ atoms/cm$^3$;
   means defining a first electrode contacting a first member of said plurality of fourth regions; and
   means defining an interconneciton electrode connecting a second member of said plurality of fourth regions to a first surface portion of said third region adjacent said surface between said first member and said second member.

2. A semiconductor device as claimed in claim 1 further comprising:
   means defining a second electrode contacting a second surface portion of said third region adjacent said surface, said second surface portion being spaced apart from said first surface portion by said second member of said fourth plurality of regions.

3. A semiconductor device as claimed in claim 2 wherein;
   said first region is comprised of at least laterally isolated portions, said laterally isolated portions being respectively positioned opposite said first and said second surface portions of said third region.

4. A semiconductor device as claimed in claim 1 wherein:
   said second member of said plurality of fourth regions substantially surrounds and is axially aligned with said first member of said plurality of fourth regions.

5. A semiconductor device as claimed in claim 1 wherein:
   said third region has comparatively shallower portions and comparatively deeper portions with respect to said surface.

6. A semiconductor device as claimed in claim 5 wherein:
   said third region has a surface impurity concentration of about $5 \times 10^{20}$ atoms/cm$^3$ and an impurity concentration of about $5 \times 10^{14}$ at said second PN junction in said comparatively deeper portion and an impurity concentration of about $5 \times 10^{14}$ atoms/cm$^3$ at said second PN junction in said comparatively shallower portion.

7. A semiconductor device as claimed in claim 5 wherein:
   said plurality of fourth regions are in said comparatively shallower portion of said third region.

* * * * *